United States Patent
Zhu et al.

(10) Patent No.: US 8,361,851 B2
(45) Date of Patent: Jan. 29, 2013

(54) METHOD FOR MANUFACTURING AN NMOS WITH IMPROVED CARRIER MOBILITY

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Bejing (CN)

( * ) Notice: Subject to any disclaimer, the term of this patent is extended or adjusted under 35 U.S.C. 154(b) by 0 days.

(21) Appl. No.: 13/063,896

(22) PCT Filed: Jun. 21, 2010

(86) PCT No.: PCT/CN2010/074145
§ 371 (c)(1),
(2), (4) Date: Mar. 14, 2011

(87) PCT Pub. No.: WO2011/079582
PCT Pub. Date: Jul. 7, 2011

(65) Prior Publication Data
US 2012/0264261 A1    Oct. 18, 2012

(30) Foreign Application Priority Data
Dec. 29, 2009    (CN) .......................... 2009 1 0244132

(51) Int. Cl.
*H01L 21/338* (2006.01)
(52) U.S. Cl. . 438/183; 257/369; 257/407; 257/E27.062; 257/E27.06; 438/300; 438/583; 438/655
(58) Field of Classification Search ............... None
See application file for complete search history.

(56) References Cited

U.S. PATENT DOCUMENTS

| | | | |
|---|---|---|---|
| 7,271,045 B2 * | 9/2007 | Prince et al. | 438/199 |
| 7,416,931 B2 * | 8/2008 | Pei | 438/197 |
| 7,682,914 B2 * | 3/2010 | Lo et al. | 438/300 |
| 8,035,165 B2 * | 10/2011 | Yeh et al. | 257/369 |
| 2002/0132413 A1 | 9/2002 | Chang et al. | |
| 2008/0157208 A1 | 7/2008 | Fischer et al. | |

FOREIGN PATENT DOCUMENTS

| | | |
|---|---|---|
| CN | 1841771 | 10/2006 |
| CN | 101162732 | 4/2008 |

* cited by examiner

*Primary Examiner* — Zandra Smith
*Assistant Examiner* — Khanh Duong
(74) *Attorney, Agent, or Firm* — Finnegan, Henderson, Farabow, Garrett & Dunner, LLP

(57) ABSTRACT

Tensile stress is applied to the channel region of an N-type metal oxide semiconductor (NMOS) transistor by directly forming a material having a tensile stress, for example, tungsten, in the contact holes on the source region and drain region of the NMOS. Then, the dummy gate layer in the gate stack of the NMOS transistor is removed, so as to further reduce the counter force of the gate stack on the channel region, thereby increasing the tensile stress in the channel region, enhancing the drift mobility of the carrier, and improving the performance of the transistor. The present invention avoids using a separate stress layer to create tensile stress in the channel region of an NMOS transistor, which advantageously simplifies the transistor manufacturing process and improves sizes and performance of the transistor.

16 Claims, 6 Drawing Sheets

METHOD FOR MANUFACTURING AN NMOS WITH IMPROVED CARRIER MOBILITY

CROSS REFERENCE TO RELATED APPLICATION

This application is a national phase application based on PCT/CN2010/074145, filed Jun. 21, 2010, which claims the priority of Chinese Patent Application No. 200910244132.8, filed Dec. 29, 2009, the content of both of which is incorporated herein by reference.

FIELD OF THE INVENTION

The present invention generally relates to a manufacturing method by which the performance of an N-type metal oxide semiconductor (NMOS) transistor can be improved through strain engineering, and more specifically, to a method for enhancing the carrier mobility by inducing stress in the channel region.

BACKGROUND OF THE INVENTION

With the development of the semiconductor technology, integrated circuits with better performance and more powerful functions require a greater element density. Thus, the sizes of the elements and the spaces between the elements need to be scaled further.

However, the scaling of element sizes in an integrated circuit will inevitably impair the constant material properties and physical effects in the operation of the transistor or other components. Therefore, many new inventions have been introduced to the design of transistors so as to maintain the performances of the components at an appropriate level.

A significant effort to maintain performance of a field effect transistor is to enhance carrier mobility. When applying a voltage to a gate isolated from a channel through a very thin gate dielectric, the carrier mobility may affect the current that flows through the channel.

It is known that, based on the type of carriers and the direction of stress, a mechanical stress in a channel region of a field effect transistor (FET) may significantly increase or decrease the drift mobility of carriers. In an FET, a tensile stress may increase the electron drift mobility and decrease the hole drift mobility, which may advantageously improve the performance of an N-type metal oxide semiconductor (NMOS); and, a compressive stress may increase the hole drift mobility and decrease the electron drift mobility, which may advantageously improve the performance of a P-type metal oxide semiconductor (PMOS). In the existing art, a considerable number of structures and materials have been proposed for including a tensile stress or compressive stress in a semiconductor material. For example, in US2006/0160317, there is provided a solution of increasing the carrier mobility in a channel by depositing a stress layer and selectively etching all or a part of gate layers in a Metal Oxide Semiconductor Field Effect Transistor (MOSFET).

However, in the prior art, the drift mobility of carriers is changed generally by providing a separate stress layer or stress interface, which is disadvantageous for the continuous scaling of device sizes and leads to a complex manufacturing process. Furthermore, with the scaling of sizes of a semiconductor device, the size of channel regions is also reduced. Therefore, when a stress material expands, the added stress applied by the stressed material on the source and/or drain regions at opposing sides of the channel region is very limited. As a result, the performance of a MOSFET transistor, particularly of an N-type field effect transistor (N-FET), cannot be improved well, and accordingly, the performance of the complementary metal oxide semiconductor (CMOS) circuit is poor. Therefore, it is desired to provide a new method for manufacturing a semiconductor device, which is capable of increasing the carrier mobility in a channel region of an NMOS transistor without using a separate stress layer, and thereby decreasing sizes of the device and simplifying the manufacturing process.

SUMMARY OF THE INVENTION

In view of the above mentioned problems, the present invention proposes a method for manufacturing an N-type field effect transistor with enhanced carrier mobility. The method comprises: forming an N-type field effect transistor on a substrate, the transistor comprising a gate stack, a source region, and a drain region, the gate stack comprising a gate dielectric layer, a metal gate layer, and a dummy gate layer; forming a contact etch stopper layer to cover the source region, the drain region, and the gate stack of the transistor; forming a first pair of contact holes on the source region and the drain region, respectively, in the contact etch stopper layer, the contact holes being adjacent to the gate stack; forming a material having a tensile stress in the first pair of contact holes to apply a tensile stress to the channel region of the transistor; and removing the dummy gate layer to increase the tensile stress in the channel region. Preferably, the material having a tensile stress is tungsten (W).

Further, after the step of removing the dummy gate layer, a stress layer or non-stress layer may be formed on the metal gate layer. In the case of forming a stress layer, a metal interconnection layer may be deposited on the metal gate layer, for example Al. In the case of forming a non-stress layer, a stressed layer having a compressive stress may be deposited on the metal gate layer, for example, a nitride layer, so as to further enhance the tensile stress of the channel region.

A protection layer and an inter-layer dielectric layer may be further formed on the device, a second pair of contact holes connected with the first pair of contact holes may be formed in the protection layer and the inter-layer dielectric layer, and contact materials having a tensile stress may be deposited in the second pair of contact holes. Thus, it is possible to form contact holes and metal contacts through two separate processes, thereby advantageously alleviating the difficulty of metal filling.

DETAILED DESCRIPTION OF THE PREFERRED EMBODIMENTS

The following disclosure provides a plurality of different embodiments or examples to achieve different structures of the present invention. To simplify the disclosure of the present invention, description of specific examples of the components and arrangements is given below. Of course, they are only illustrative and not intend to limit the present invention. Moreover, in the present invention, reference numbers and/or letters may be repeated in different embodiments. Such a repetition is for the purposes of simplification and clearness, and does not denote relationships between the respective embodiments and/or arrangements being discussed. In addition, the present invention provides various examples for specific processes and materials. However, it will be understood by a person of ordinary skill in the art that other processes and/or materials may also be utilized. Furthermore, in the following description, a structure in which a first object is "on" a second object may include an embodiment in which the first object and the second object are formed to be in direct contact with each other and an embodiment in which another object is formed between the first object and the second object such that the first and second objects might not be in direct contact with each other. It should be noted that the components as illustrated in the appending drawings may not be drawn to scale. Descriptions on known elements, processing techniques and methods are omitted so as to avoid unwanted limitations to the present invention.

As mentioned above, when the channel region is manipulated by a tensile stress, the performance of an N-type field effect transistor (NMOS) may be improved. In an embodiment of the present invention, a material having a tensile stress is formed in contact holes on the source region and drain region of the NMOS, thereby applying a tensile stress to the channel region of the NMOS transistor; and then a dummy gate layer in the gate stack of the NMOS transistor is removed so as to further reduce the counter force from the gate stack on the channel region, thereby enhancing the tensile stress in the channel region. In an embodiment of the present invention, the material having a tensile stress is tungsten (W). In particular, a stress layer having a compressive stress may be further deposited in the gate stack, thereby further enhancing the tensile stress in the channel region. By virtue of the manufacturing method according to the present invention, a separate stress layer is unnecessary, and the tensile stress in the channel region of the NMOS transistor is enhanced by filling stressed material in contact holes and then selectively removing a certain part of the gate stack.

Figure 1:
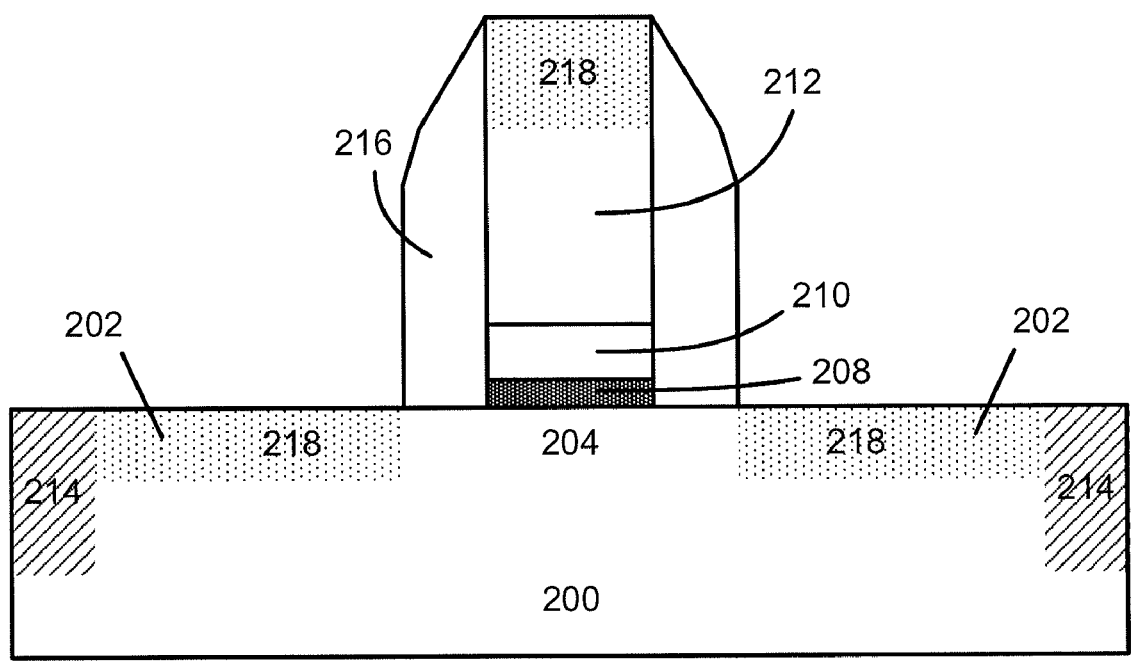
FIGS. 1 to 7 are schematic cross-section diagrams of an N-type field effect transistor in different phases according to an embodiment of the present invention.
Figure 8:
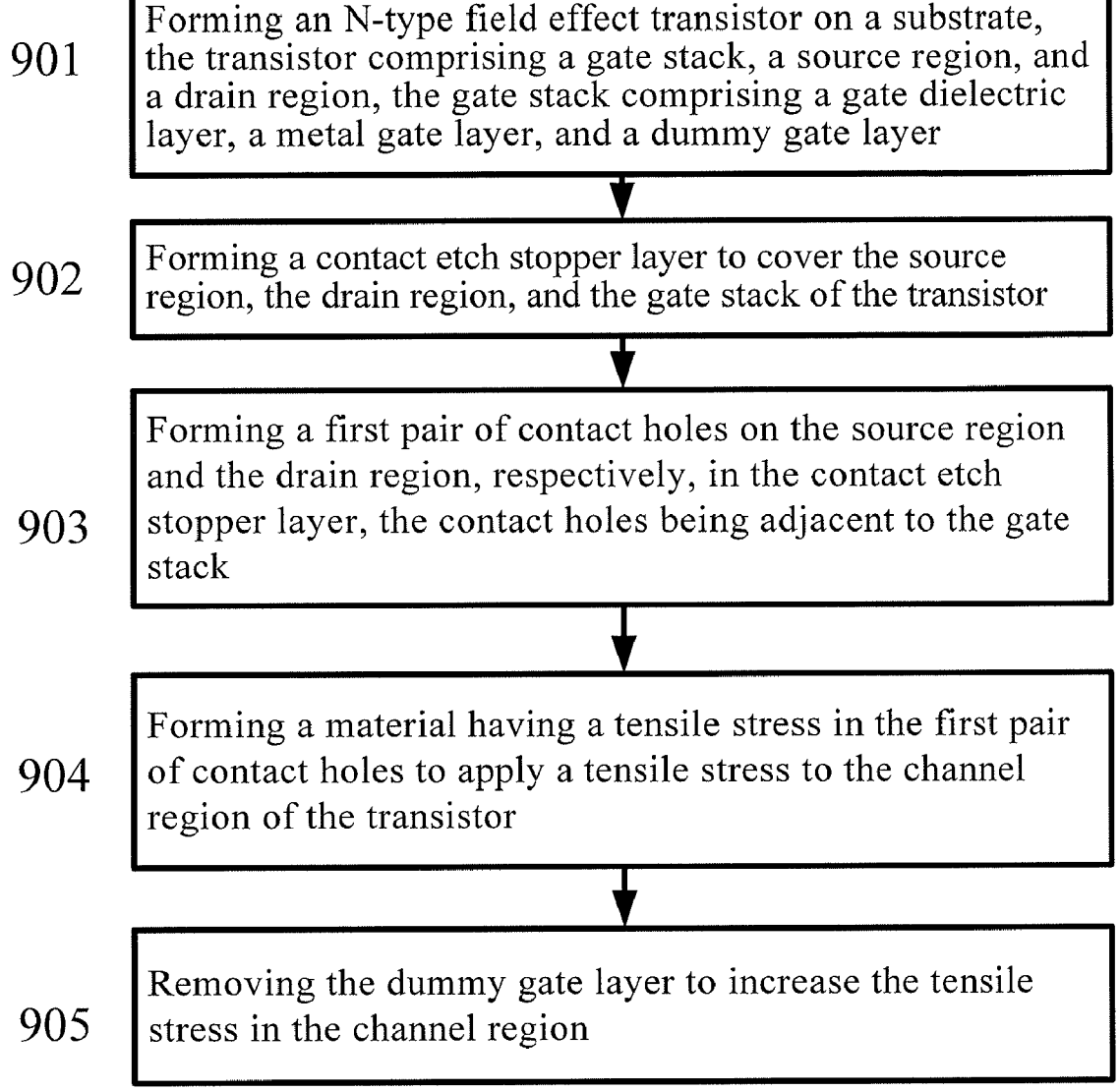
FIG. 8 is a flowchart illustrating a method for manufacturing an N-type field effect transistor according to an embodiment of the present invention.

With reference to FIG. 8, FIG. 8 is a flowchart illustrating a method for manufacturing an N-type field effect transistor according to an embodiment of the present invention. At step 901, an N-type field effect transistor on a substrate is provided, the transistor comprising a gate stack which comprises a gate dielectric layer, metal gate layer, and a dummy gate layer. As shown in FIG. 1, the NMOS transistor on the wafer is formed by a known process technology, the transistor comprising a substrate 200, a source region and a drain region 202 on the substrate, and a gate stack 206 located between the source and drain regions, the gate stack comprising a gate dielectric layer 208, a metal gate layer 210, and a dummy gate layer 212. The semiconductor substrate may comprise any one of the semiconductor materials, including, but not limited to, silicon, germanium, silicon-germanium, silicon-germanium alloy, silicon carbide, silicon carbide: germanium alloy, etc. Typically, the semiconductor substrate 200 may have a thickness of about several hundreds of micrometers, but not limited thereto, for example, it may have a thickness between 5 and 70 micrometers. Many processes and materials for forming an NMOS transistor are well-known to the skilled in the art.

Particularly, as shown in FIG. 1, an isolation region, for example, shallow trench isolation (STI) structure 214, may be formed in the semiconductor substrate 200, so as to electrically isolate continuous field effect transistors. A source region and a drain region are formed in the substrate and connected to the channel 204. On the channel is formed a gate stack 206 comprising a gate dielectric layer 208, a metal gate layer 210, and a dummy to gate layer 212. For example, firstly, a gate dielectric layer 208 is formed on the substrate, which may be formed by depositing a high-k material, for example, $HfO_2$, $HfSiO$, $HfSiON$, $HfTaO$, $HfTiO$, or $HfZrO$, the thickness of the gate dielectric layer being about 2-10 nm. Next, a metal gate layer 210 is formed on the gate dielectric layer 210, which may be formed by depositing, for example, TaC, TiN, TaTbN, TaErN, TaYbN, TaSiN, HfSiN, MoSiN, $RuTa_x$, or $NiTa_x$, with a thickness of about 2-10 nm. A dummy gate layer 212 is formed on the metal gate layer 210, which is formed by depositing, for example, Poly-Si or Poly-SiGe. Then, the transistor is patterned and etched, so as to from a gate stack 206. In particular, a sidewall spacer 216 is formed on the sidewalls of the gate stack. The sidewall spacer 216 may be, but not limited to, a nitride material, and may be formed by a method for forming a sidewall spacer known in the art.

Optionally, a metal silicide layer 218 may be formed on the surfaces of the source region, the drain region, and the dummy gate layer. For example, a thin metal layer, for example, Ni or Co, may be firstly deposited on the surfaces of the source region, the drain region, and the dummy gate layer, and then an anneal is conducted to the transistor, such that the deposited metal layer in corresponding regions of the substrate 200 will has a chemical reaction with the substrate 200 disposed therebeneath, thereby forming a metal silicide, for example, NiSi, NiPtSi or $CoSi_2$, on the surface of the transistor contacting with the metal layer. On the other hand, the deposited metal layer corresponding to the dummy gate layer 212 region will have a chemical reaction with the poly-dummy gate layer 212 disposed therebeneath, thereby forming a metal silicide on the surface of the transistor contacting with the metal layer. Next, etch is performed to remove the un-reacted metal layer and thereby to form metal silicide layer. The metal silicide layer 218, for example, NiSi, NiPtSi, or $CoSi_2$ layer, may play a role of reducing resistance.

Figure 2:
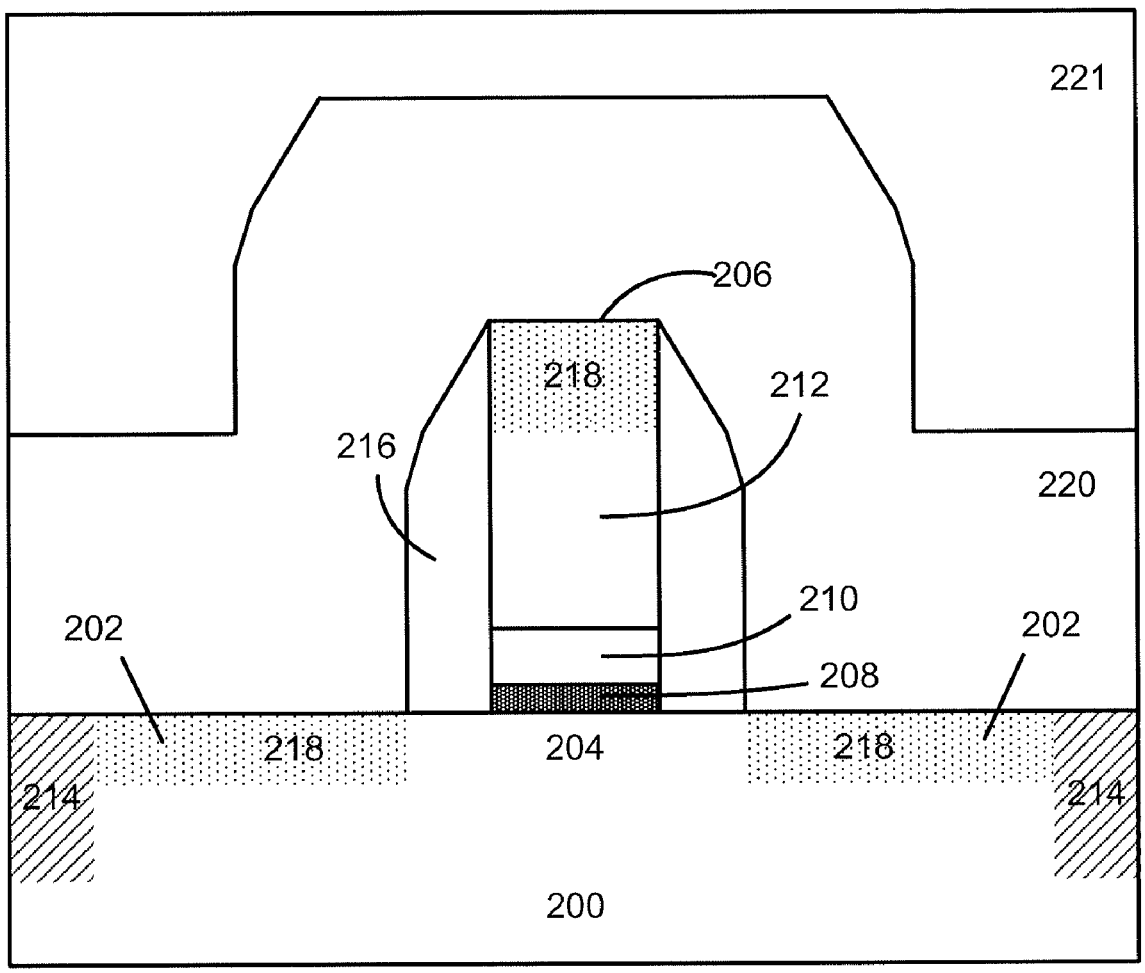
Figure 3:
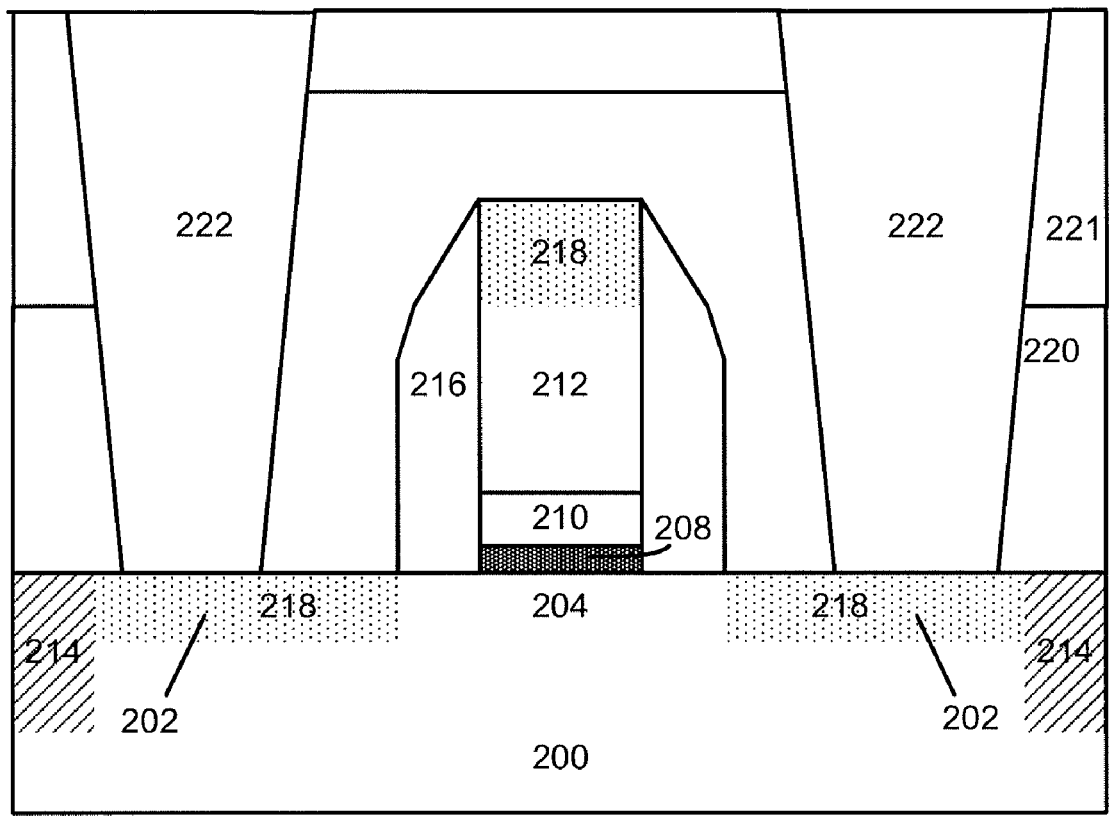

Next, at step 902, a contact etch stopper layer 220 and an etch protective layer 221 are formed to cover the source region, drain region 202, and gate stack 206, as shown in FIG. 2. The contact etch stopper layer 220 may be formed by a deposition process known in the art and may be, but not limited to, a nitride layer, for example, a silicon nitride layer, with a deposition thickness which may be about 10-100 nm. The etch protective layer 221 may comprise, for example, a SiO2 layer, for preventing the subsequent chemical-mechanical polishing (CMP) process from damaging the gate stack. In an embodiment, the thickness of the SiO2 layer 221 may be in a range between 100 and 300 nm. The method proceeds to step 903, where a first pair of contact holes 222 are formed in the contact etch stopper layer on the source region and drain region, the holes 222 being adjacent to the gate stack, as shown in FIG. 3. The contact holes 222 may be formed by a method of forming contact holes known in the art, for example, by a reactive ion etch. The contact holes 222 may be located at a distance of about 10 nm-50 nm from the gate stack or the sidewall spacer.

Figure 4:
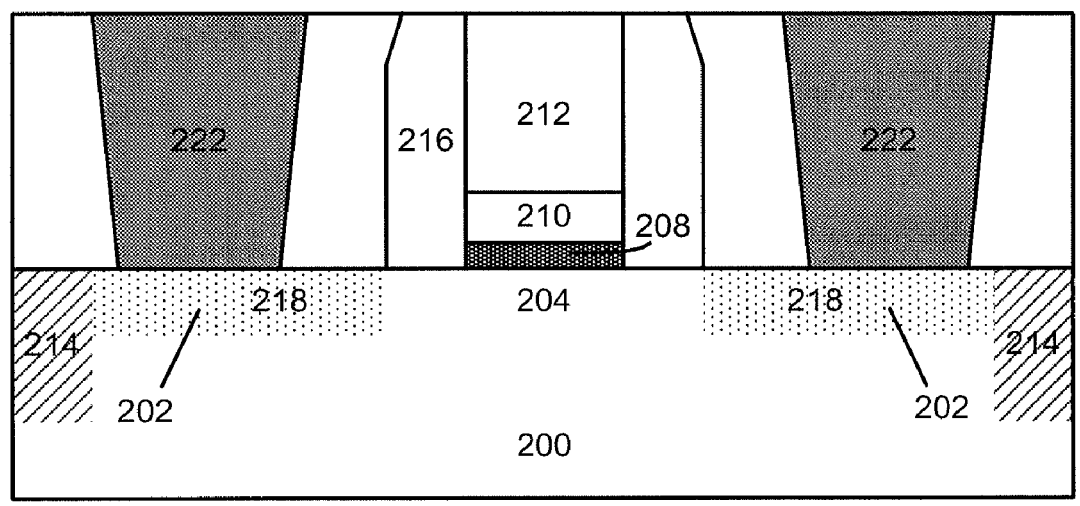

Next, at step 904, as shown in FIG. 4, a material having a tensile stress is formed in the first pair of contact holes, thereby applying tensile stress to the channel region of the transistor. The material having a tensile stress may be, but not limited to, tungsten. The contact may be formed by a method for deposition in contact holes known in the art. For example, optionally, a TiN layer (not shown) may be firstly deposited in the contact holes, and then a tungsten contact is formed on the TiN layer, the deposited TiN layer having a role of diffusion barrier layer, which prevents the tungsten subsequently deposited in the contact holes 222 from diffusing into the silicon. Finally, a chemical-mechanical polishing (CMP) is performed to the transistor to expose the dummy gate layer, and the chemical-mechanical polishing process stops at the side contact etch stopper layer 220 corresponding to the source and drain regions, thereby forming a pair of stress contacts 222 of tungsten and exposing the dummy gate layer 212. By providing a protective layer such as SiO2 layer 221, the damage to the gate stack by over polishing during the CMP process may be avoided, in particular during the polishing of the contact etch stopper layer 220 on the gate stack 216.

Figure 5:
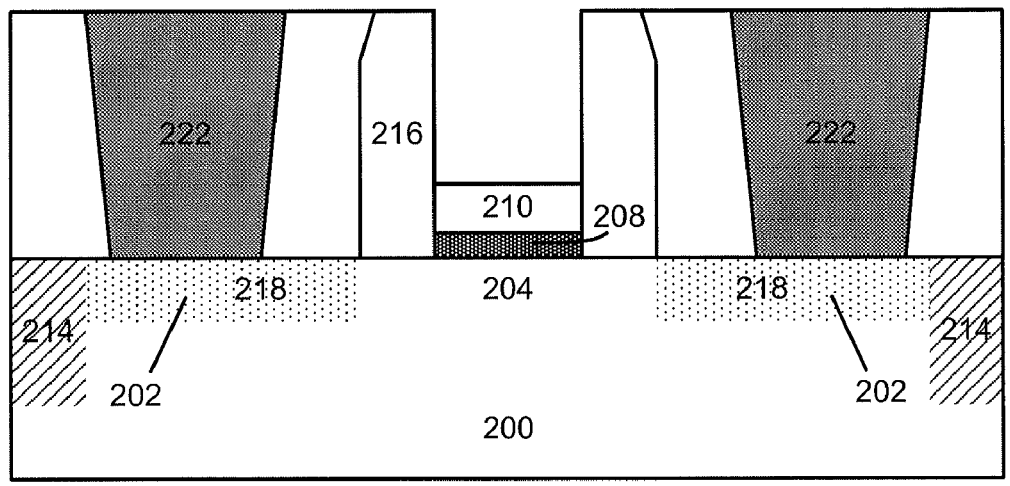

Next, at step 905, as shown in FIG. 5, the dummy gate layer 212 is removed to increase the tensile stress in the channel region. Since the material of the dummy gate layer 212 is poly-silicon or poly-silicon germanium, it may be removed by, for example, a dehydrogenation etching mixture gas. Removal of the dummy gate layer leads to a reduction of the counter force from the gate stack, thereby further increasing the tensile stress in the channel region.

Figure 6:
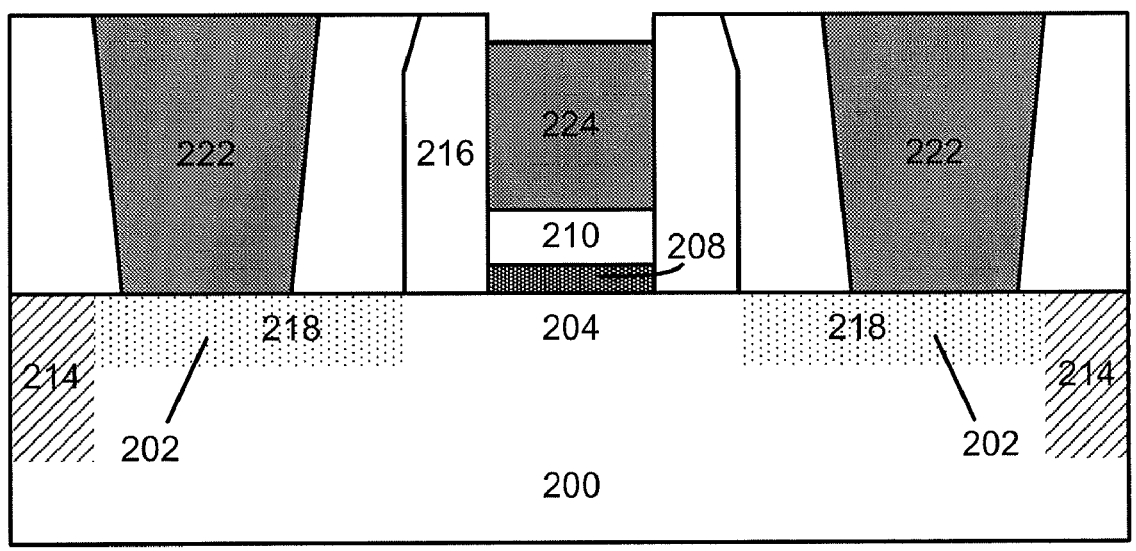

Optionally, as shown in FIG. 6, a stressed layer or a non-stressed layer 224 may be deposited on the metal gate layer. In the case that a stressed layer is deposited, the stressed layer may be a material having a stress contrary to that of the material filled in the contact holes, so as to further increase the tensile stress in the channel region. For example, a material having a compressive stress may be deposited, which includes, but not limited to, TiAl or compressive stressed silicon nitride, etc. In the case that a non-stressed layer is deposited, a metal interconnection layer may be deposited on the metal gate layer, a material of the metal interconnection layer including, but not limited to, Al.

Figure 7:
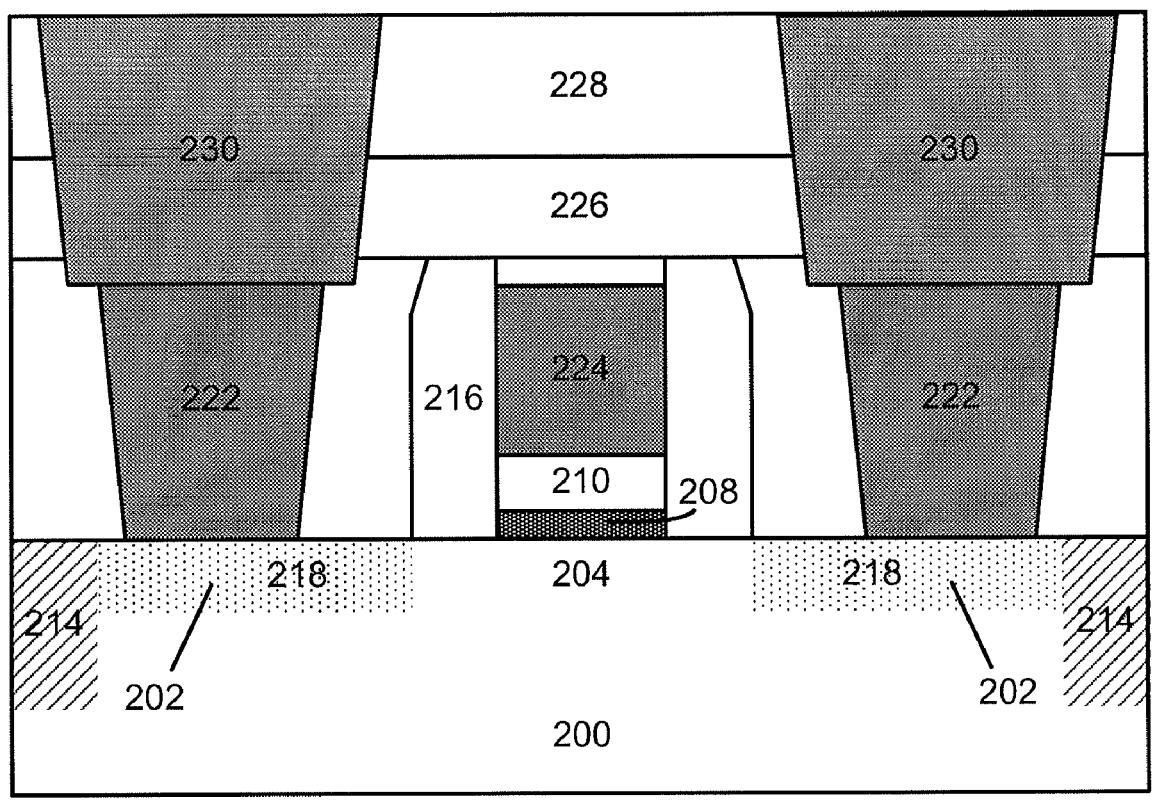

Specifically and optionally, as shown in FIG. 7, a protective layer 226 and an inter-layer dielectric layer 228 are formed to cover the contact etch stopper layer, the surfaces of the contact holes, and the surface of the gate stack. Then, a second pair of contact holes 230 connected with the first pair of contact holes 222 are formed in the protective layer and inter-layer dielectric layer, and a contact material is deposited in the second contact holes. The protective layer and the inter-layer dielectric layer may be formed by a process known in the art, including, but not limited to, plasma deposition, chemical vapor deposition, etc. The protective layer may comprise a nitride layer, which includes, but not limited to silicon nitride, and its deposition thickness may be, for example, about 10-30 nm. The inter-layer dielectric layer 228 may comprise an oxide layer and a low-k material (but not limited to) and its deposition thickness may be about 10-200 nm. The protective layer 226 is deposited on the NMOS transistor and can seal the transistor for protection, so as to prevent the external environment, such as moisture, from influencing the transistor. The inter-layer dielectric layer 228 may improve the electrical performance of the fabricated N-FET transistor.

The contact material deposited in the second pair of contact holes may include, but not limited to, tungsten. Thus, contact holes and metal contacts are formed in two separate steps, thereby advantageously reducing the difficulty of metal filling.

By applying an embodiment of the present invention, tensile stress is applied in the channel region of the NMOS transistor by directly forming a material having a tensile stress, for example, tungsten, in the contact holes on the source region and drain region of the NMOS. Then, a dummy gate layer in the gate stack of the NMOS transistor is removed, so as to further reduce the counter force from the gate stack on the channel region, thereby increasing the tensile stress in the channel region, enhancing the drift mobility of the carriers, and improving the performance of the transistor. The present invention avoids the use of a separate stress layer to create tensile stress in the channel region of an NMOS transistor, thereby advantageously simplifying the device manufacturing process and improving sizes and performance of the device. In particular, a protective layer and an inter-layer dielectric layer may be further formed on the device. A second pair of contact holes connected with the first pair of contact holes may be formed in the protective layer and the inter-layer dielectric layer, and a contact material may be deposited in the second pair of contact holes. Thus, contact holes and metal contact may both be formed in two separate steps, thereby advantageously reducing the difficulty of metal filling.

Although the exemplary embodiments and their advantages have been described in detail, it is readily apparent to those having ordinary skills in the art that various alterations, substitutions and modifications may be made to the embodiments without departing from the spirit of the present invention and the scope as defined by the appended claims. As for other examples, it may be easily recognized by a person of ordinary skills in the art that the order of the process steps may be changed without departing from the scope of the present invention.

In addition, the scope to which the present invention is applied is not limited to the process, mechanism, manufacture, material composition, means, methods, or steps described in the specific embodiments in the specification. A person of ordinary skills in the art would readily appreciate from the disclosure of the present invention that the process, mechanism, manufacture, material composition, means, methods, and steps currently existing or to be developed in future, which perform substantially the same functions or achieve substantially the same results as that in the corresponding embodiments described in the present invention, may be applicable according to the teaching of the present invention. Therefore, it is intended that the scope of the appended claims of the present invention includes these process, mechanism, manufacture, material composition, means, methods, and steps.

What is claimed is:

1. A method for manufacturing an N-type field effect transistor with enhanced carrier mobility, comprising:
    forming an N-type field effect transistor on a substrate, the transistor comprising a gate stack, a source region, and a drain region, the gate stack comprising a gate dielectric layer, a metal gate layer, and a dummy gate layer;
    forming a contact etch stopper layer to cover the source region, the drain region, and the gate stack of the transistor;
    forming a first pair of contact holes on the source region and the drain region, respectively, in the contact etch stopper layer, the contact holes being adjacent to the gate stack;
    forming a material having a tensile stress in the first pair of contact holes to apply a tensile stress to the channel region of the transistor;
    removing the dummy gate layer to increase the tensile stress in the channel region; and
    after removing the dummy gate layer, forming a stressed layer having a compressive stress on the metal gate layer, so as to further increase the tensile stress in the channel region.

2. The method according to claim 1, wherein the material having a tensile stress is tungsten.

3. The method according to claim 2, wherein the step of forming the material having a tensile stress in the first pair of contact holes further comprises:
  forming a TiN layer in the contact holes;
  forming a tungsten contact on the TiN layer; and
  performing chemical-mechanical polishing on the transistor to expose the dummy gate layer.

4. The method according to claim 1, further comprising:
  forming a metal interconnection layer on the metal gate layer after the step of removing the dummy gate layer.

5. The method according to claim 4, wherein a material of the metal interconnection layer comprises Al.

6. The method according to claim 1, wherein the stressed layer is a TiAl layer or a silicon nitride layer.

7. The method according to claim 1, further comprising:
  before the step of forming the contact etch stopper layer, forming a metal silicide layer on the surfaces of the source region, the drain region, and the dummy gate layer of the transistor.

8. The method according to claim 7, wherein the metal silicide layer comprises NiSi or $CoSi_2$.

9. The method according to claim 1, wherein the first pair of contact holes are formed at a distance of about 10-50 nm from the respective sidewalls of the gate stack.

10. The method according to claim 1, further comprising:
  after the step of forming a material having a tensile stress, performing chemical-mechanical polishing on the transistor so as to expose the dummy gate layer.

11. The method according to claim 1, wherein the contact etch stopper layer comprises a nitride layer.

12. The method according to claim 1, wherein the step of forming the transistor further comprises a step of forming a sidewall spacer on the sidewalls of the gate stack.

13. The method according to claim 1, further comprising:
  after the step of removing the dummy gate, covering the contact etch stopper layer, the surfaces of the contact holes, and the surface of the gate stack to form a protective layer and an inter-layer dielectric layer, forming a second pair of contact holes connected with the first pair of contact holes in the protective layer and the inter-layer dielectric layer, and depositing a contact material having a tensile stress in the second pair of contact holes.

14. The method according to claim 13, wherein the protective layer comprises a nitride layer.

15. The method according to claim 13, wherein the inter-layer dielectric layer comprises an oxide layer or a low-k material.

16. The method according to claim 13, wherein the contact material having a tensile stress is tungsten.

* * * * *